United States Patent [19]

Kobayashi

[11] Patent Number: 5,175,610
[45] Date of Patent: Dec. 29, 1992

[54] RESIN MOLDED TYPE SEMICONDUCTOR DEVICE HAVING A METALLIC PLATE SUPPORT

[75] Inventor: Kazuhito Kobayashi, Kawasaki, Japan

[73] Assignee: Kabushiki Kaisha Toshiba, Kawasaki, Japan

[21] Appl. No.: 873,689

[22] Filed: Apr. 24, 1992

Related U.S. Application Data

[63] Continuation of Ser. No. 696,737, May 7, 1991, abandoned.

[30] Foreign Application Priority Data

May 9, 1990 [JP] Japan .................................. 2-117741

[51] Int. Cl.⁵ ..................... H01L 23/28; H01L 29/44; H01L 39/02; H01L 23/02
[52] U.S. Cl. ..................................... 257/676; 257/783
[58] Field of Search ...................... 357/72, 68, 70, 81, 357/70, 74, 75, 80, 85

[56] References Cited

U.S. PATENT DOCUMENTS

| | | | |
|---|---|---|---|
| 4,994,895 | 2/1991 | Matsuzaki et al. | 357/68 |
| 5,001,542 | 3/1991 | Tsukagoshi et al. | 357/72 |
| 5,001,547 | 3/1991 | Luigi | 357/72 |
| 5,019,673 | 5/1991 | Juskey et al. | 357/72 |
| 5,045,151 | 9/1991 | Edell | 357/72 |

*Primary Examiner*—Andrew J. James
*Assistant Examiner*—Carl Whitehead, Jr.
*Attorney, Agent, or Firm*—Finnegan, Henderson, Farabow, Garrett and Dunner

[57] ABSTRACT

A semiconductor chip is attached to the upper surface of a bed formed of a metallic plate. Lead terminals are connected to terminal portions of the semiconductor chip by bonding wires. A plurality of bridge-shaped projections are formed on the lower surface of the bed, by punching a material which constitutes the bed. The portions including the bed, semiconductor chip and projections are molded and sealed with mold resin. In this case, the mold resin is filled in the space defined by the bridge portions which constitute the projections.

7 Claims, 3 Drawing Sheets

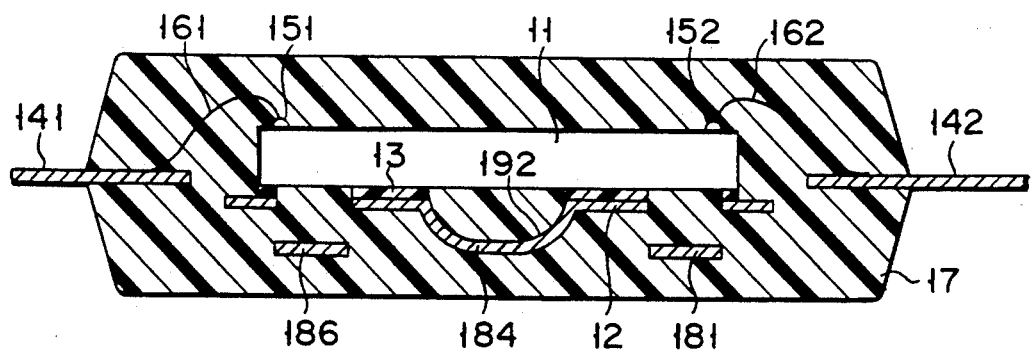
F I G. 1
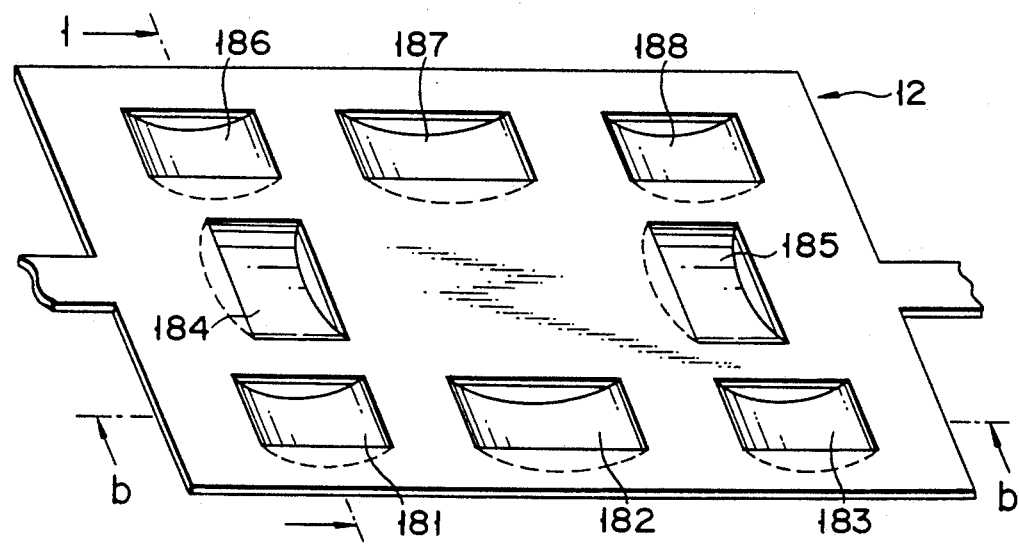
F I G. 2A
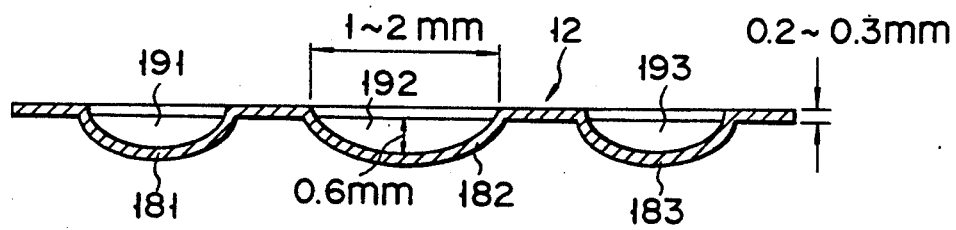
F I G. 2B

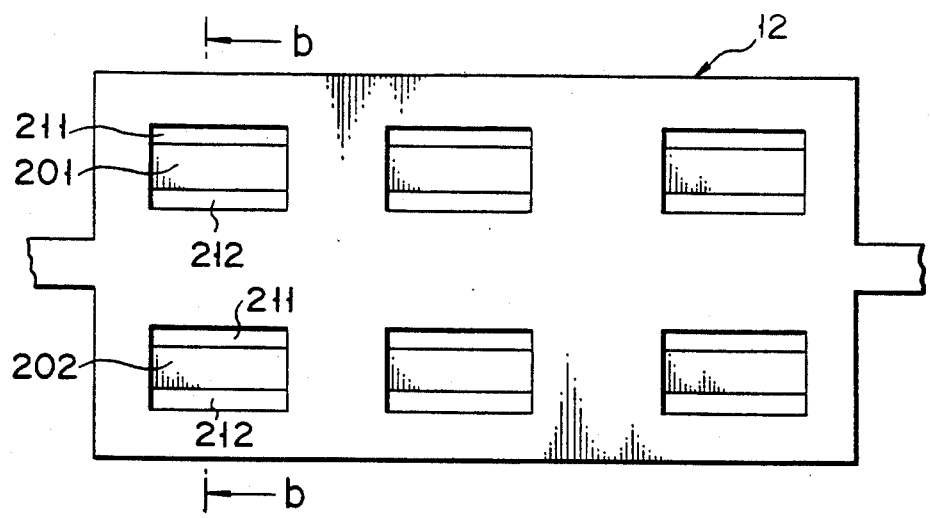
F I G. 3A
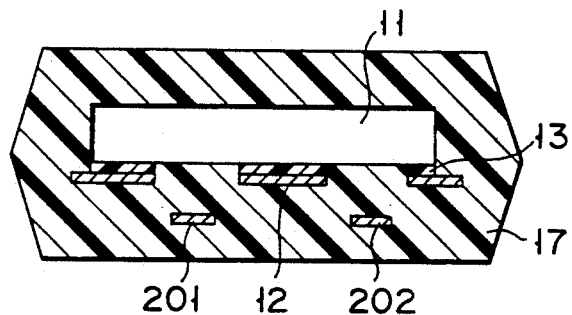
F I G. 3B
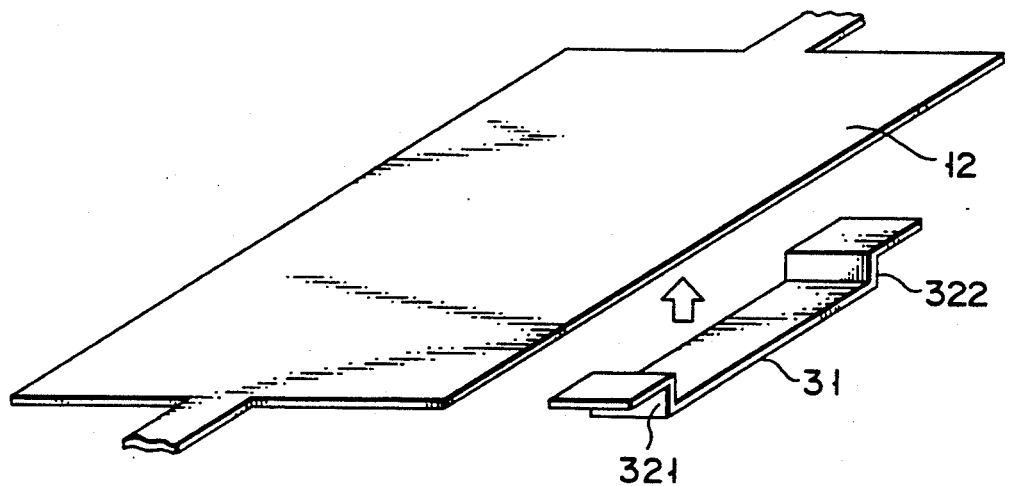
F I G. 4

RESIN MOLDED TYPE SEMICONDUCTOR DEVICE HAVING A METALLIC PLATE SUPPORT

This application is a continuation of application Ser. No. 07/696,737, filed May 7, 1991, now abandoned.

BACKGROUND OF THE INVENTION

1. Field of the Invention

The present invention relates to a resin-molded type semiconductor device wherein a semiconductor chip on which a semiconductor circuit having a great number of circuit elements is formed is mounted on a bed of a lead frame constituted by an electrically conductive plate member, and the bed portions and semiconductor chip are molded and sealed with synthetic resin.

2. Description of the Related Art

The resin-molded type semiconductor device has, for example, an SOJ (Small Outline J lead) package type structure, as shown in FIG. 7A. In this apparatus, a semiconductor chip 52 is mounted on a bed 51 of a lead frame constituted by a metallic plate of, e.g. copper or conductive alloy. The bottom surface of the semiconductor chip 52 is adhered to the bed 51 by use of an adhesive 53 of an epoxy resin, etc. Electrodes 521, 522 ... of the semiconductor chip 52 attached to the bed 51 are connected to lead terminals 551, 552, ..., which are led to the outside, by means of bonding wires 541, 542, .... The semiconductor chip 52 formed integral with the bed 51, lead terminals 551, 552, ... and bonding wires 541, 542, ... are molded with molding resin 56.

In the resin-molded type semiconductor device having the above structure, the molding resin 56 has a moisture-absorbing property, and, as shown in FIG. 7B, moisture 57 accumulates at the interfaces of the bed 51 and molding resin 56. Consequently, for example, when the semiconductor device suffers heat shock in a solder bath in the case of mounting the semiconductor device, the moisture 57 at the interface vaporizes and expands, thereby stretching out the molding resin 56, deforming the outer shape of the molding resin 56 and causing cracks 58 to occur.

The possibility of cracks 58 occurring depends greatly on the kind of material used for mold resin 56, of which a semiconductor device package is formed, the characteristic of the material, the size of the semiconductor chip 52, etc. In particular, as the ratio of the volume of semiconductor chip 52 to the volume of the package increases, the possibility of cracking also increases. Where the crack 58 occurs, bonding wires may be severed, and contaminants and moisture may enter through the crack 58, resulting in corrosion of the semiconductor chip 52.

In addition, in the above device, the bottom surface of the bed 51 is flat, and mold resin 56 is in contact with the flat bottom surface. If crack 58 occurs, the bottom surface of the bed 51 is separated from the mold resin 56, and the reliability of the semiconductor device is lowered.

SUMMARY OF THE INVENTION

An object of the present invention is to provide a highly reliable resin-molded type semiconductor device capable of preventing such undesirable consequences as, for example, cracks occurring in the in mold resin or the lower surface of the bed separating from the mold resin when the device suffers heat sock at the time of actual mounting.

Another object of the invention is to prevent such an undesirable conditions as moisture accumulating in the mold resin owing to moisture absorption, which leads to cracks, and separation of resin around the bed and lead terminals. Thus, even if the device of this invention suffers heat shock, the stress due to water evaporation/expansion is dispersed.

Still another object of the invention is to provide a highly reliable resin-molded type semiconductor device wherein firm connection between the lower surface of the bed and the mold resin is ensured.

According to a resin-molded type semiconductor device of this invention, the main body of the device is formed such that a semiconductor chip is attached and fixed to the upper surface of a bed which is a structural element of a lead frame, and terminal portions of the semiconductor chip are connected to lead terminals by means of bonding wires. The main body is sealed with mold resin. This device is characterized in that projections are integrally formed on the lower surface of the bed, opposite from the upper surface on which the semiconductor chip is attached, and the mold resin.

In the semiconductor device having the above structure, the projections are formed on the lower surface of the bed, and the moisture absorbed by the mold resin adheres to the uneven surface of the projections of the bed in a dispersed form. For example, even if the device suffers heat shock at the time of actually mounting the device and the moisture is evaporated and expanded, the stress due to evaporation and expansion acts on the mold resin separately, and the possibility of problems such as cracks appearing in the mold resin can effectively be reduced. In addition, since the projections on the lower surface of the bed are buried in the mold resin, the lower surface of the bed, which is a particularly large flat surface, can be firmly connected to the mold resin, and separation between the lower surface of the bed and the resin can positively be prevented. Therefore, the reliability of the semiconductor device can be remarkably enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view of a semiconductor device according to a first embodiment of the invention;

FIG. 2A is a perspective view showing a bed of a lead frame which a structural element of the semiconductor device shown in FIG. 1;

FIG. 2B is a cross-sectional view taken along line b—b in FIG. 2A;

FIG. 3A is a plan view showing a bed employed in a semiconductor device according to a second embodiment of the invention;

FIG. 3B is a cross-sectional view taken along line b—b in FIG. 3A

FIG. 4 is a partially exploded view of a bed employed in a semiconductor device according to a third embodiment of the invention;

DETAILED DESCRIPTION OF THE PREFERRED EMBODIMENTS

Figure 5:
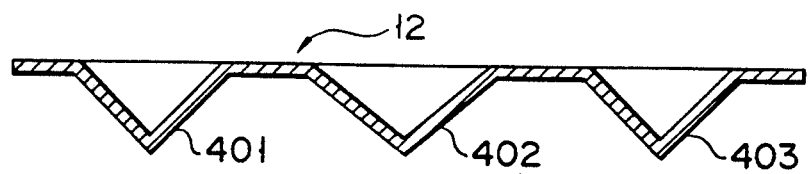
FIGS. 5 and 6 are cross-sectional views of beds used in semiconductor devices according to fourth and fifth embodiments of the invention, respectively.

FIG. 1 shows a cross-sectional view of a semiconductor device according to a first embodiment of the invention. A semiconductor chip 11 is attached to a bed 12 of a metallic lead frame, made of copper or conductive alloy, by means of an adhesive 13 of an epoxy resin. A plurality of lead terminals 141, 142, ... of the lead frame are arranged around the bed 12. Terminals 151, 152, ... of the semiconductor chip 11 are electrically connected to the lead terminals 141, 142, ... by bonding wires 161, 162, ... The semiconductor chip 11, bed 12, bonding wires 161, 162, ... and part of the lead terminals 151, 152, ... are packaged with mold resin 17.

FIG. 2 shows the bed 12 included in the above semiconductor device. The bed 12 is provided with a plurality of projections 181, 182, ... which project away from the surface on which the chip 11 is attached. The projections 181, 182, ... are punched or struck from a plate member of which the bed 12 is formed. Each projection has a bridge portion with opposite ends joined with the bed and curved towards the lower side of the bed 12.

Mold resin 17 enters the projections 181, 182, ... or spaces 191, 192, ... defined by the bridge portions, as shown in FIG. 1. The bed 12 and the mold resin 17 are integrally formed.

While the bed 12 is formed of a metallic plate having a thickness of about 0.2 mm to 0.3 mm, the length of each projection 181, 182, ... is about 1 mm to 2 mm. The depth of the space defined by the bridge portion of each projection is more than double the thickness of the bed 12, e.g. 0.6 mm.

In this semiconductor device, plural projections 181, 182, ... are formed on the bottom surface of the bed 12, and moisture which accumulates on the surfaces in the device is dispersed. Consequently, when the device suffers heat shock, the stress acting to stretch the resin material towards the bottom side of the bed 12 is also dispersed. In addition, since resin material is used to fill in the spaces 191, 192, ... of the projections 181, 182, ..., separation between the bed 12 and the underlying mold resin 17 is effectively prevented. Thus, the occurrence of cracks in the mold resin is prevented, and the reliability of the semiconductor device is enhanced.

FIG. 3A is a plan view showing a bed employed in a semiconductor device according to a second embodiment of the invention. A plurality of projections 201, 202, ... are formed on the bottom surface of the bed 12, so as to project towards the bottom side of the bed 12. Though each projection is formed of a curved bridge portion, as in the first embodiment; in this embodiment, through-holes 211 and 212 are formed on both sides of each bridge portion.

FIG. 3B is a cross-sectional view taken along line b—b in FIG. 3A, showing the cross-sectional structure of the semiconductor device having bed 12. A semiconductor chip 11 is attached to the bed 12 by means of an adhesive 13. The chip 11, along with the bed 12, is sealed with mold resin 17. The resin 17 easily enters the spaces defined by the projections 201, 202, ... through the holes 211 and 212.

With the above structure of bed 12, moisture in mold resin 17 is widely dispersed in the region of bed 12, and resin is easily fills in the inner spaces of the projections. Thus, the occurrence of voids in the mold region 17 is prevented.

In the above embodiments, the projections were formed by punching the metallic plate which constitutes the bed 12. As is shown in FIG. 4, however, it is possible to form the bed 12 of a flat plate and attach a projection 31 to the lower surface of the plate by welding or by using of an adhesive. The projection 31 is formed, for example, by shaping a metallic plate, similar to the plate of the bed 12, into a bridge with a pair of legs 321 and 322, and coupling the legs 321 and 322 to the lower surface of the bed 12.

Figure 6:
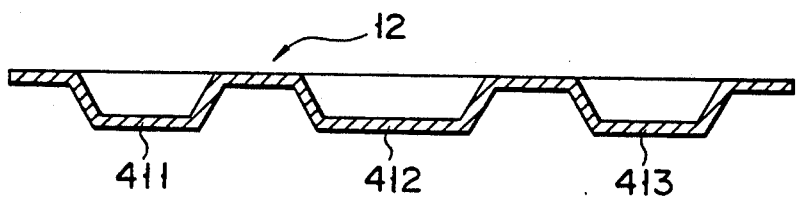
Figure 7A:
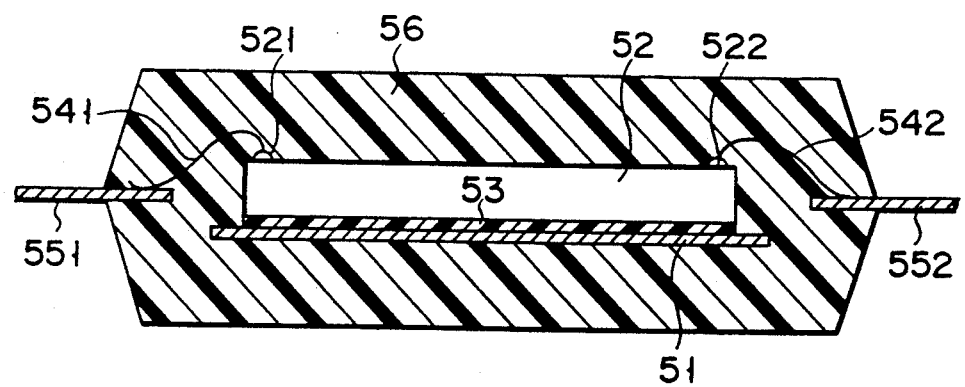
FIG. 7A is a cross-sectional view showing a conventional resin-molded type semiconductor device.
Figure 7B:
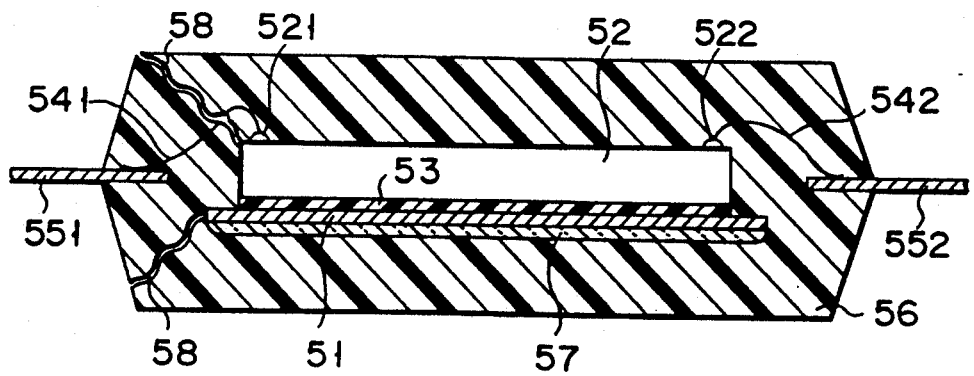
FIG. 7B is a view explaining the state in which cracks occur in the semiconductor device shown in FIG. 7A.

The shape of the projection extending from the lower surface of the bed 12 may have a desired shape. For example, the projection may be formed by a bridge 401, 402, ... having a triangular profile, as shown in FIG. 5, or by a bridge 411, 412, ... having a rectangular profile, as shown in FIG. 6.

Additional advantages and modifications will readily occur to those skilled in the art. Therefore, the invention in its broader aspects is not limited to the specific and details, representative devices, shown and described herein. Accordingly, various modifications may be made without departing from the spirit or scope of the general inventive concept as defined by the appended claims and their equivalents.

What is claimed is:

1. A resin-molded type semiconductor device, comprising:
    a semiconductor chip having a bottom surface;
    a bed having an upper surface underlying at least a major portion of the bottom surface of the semiconductor chip, and a lower surface opposite from the upper surface;
    adhesive means for fixing the bottom surface of the semiconductor chip to the upper surface of the bed;
    a plurality of projections depending from the lower surface of the bed, each of said projections comprising a bridge member having opposite ends joined to the bed; and
    mold resin enclosing the semiconductor chip and the bed and filling the spaces defined by the projection bridge members.

2. A device according to claim 1, wherein each of said projections is struck from the bed.

3. A device according to claim 1, wherein each of the bridge members is of arcuate profile between the opposite ends thereof.

4. A device according to claim 1, wherein each of the bridge members is of triangular profile between the opposite ends thereof.

5. A device according to claim 1, wherein each of the bridge members is of rectangular profile between the ends thereof.

6. A device according to claim 1, wherein each of the bridge members is struck from the lower surface of the bed to define through-holes in the bed on both sides of the bridge member.

7. A device according to claim 1, wherein each of the projections is a generally U-shaped plate body attached at opposite ends to the lower surface of the bed, the lower surface having a flat shape.

* * * * *